(12) United States Patent
Park

(10) Patent No.: US 10,181,454 B2
(45) Date of Patent: Jan. 15, 2019

(54) DUMMY TSV TO IMPROVE PROCESS UNIFORMITY AND HEAT DISSIPATION

(75) Inventor: Changyok Park, Ontario (CA)

(73) Assignee: ATI Technologies ULC, Markham, Ontario (CA)

(*) Notice: Subject to any disclaimer, the term of this patent is extended or adjusted under 35 U.S.C. 154(b) by 729 days.

(21) Appl. No.: 12/716,902

(22) Filed: Mar. 3, 2010

(65) Prior Publication Data

US 2011/0215457 A1 Sep. 8, 2011

(51) Int. Cl.
*H01L 25/065* (2006.01)
*H01L 23/367* (2006.01)
*H01L 23/48* (2006.01)

(52) U.S. Cl.
CPC ...... *H01L 25/0657* (2013.01); *H01L 23/3677* (2013.01); *H01L 23/481* (2013.01); *H01L 2224/2919* (2013.01); *H01L 2224/32145* (2013.01); *H01L 2224/9202* (2013.01); *H01L 2225/06541* (2013.01); *H01L 2225/06565* (2013.01); *H01L 2225/06589* (2013.01)

(58) Field of Classification Search
CPC ......... H01L 23/481; H01L 2225/06541; H01L 2225/06589
USPC ....................................................... 257/712
See application file for complete search history.

(56) References Cited

U.S. PATENT DOCUMENTS

| | | | |
|---|---|---|---|
| 7,432,592 B2 | 10/2008 | Shi et al. | |
| 7,592,697 B2 | 9/2009 | Arana et al. | |
| 7,598,523 B2 | 10/2009 | Luo et al. | |
| 7,649,249 B2 | 1/2010 | Noguchi | |
| 8,436,465 B2 | 5/2013 | Sugaya | |
| 2002/0163072 A1* | 11/2002 | Gupta | H01L 21/76898 257/698 |
| 2003/0058630 A1* | 3/2003 | Takano et al. | 361/783 |
| 2004/0232554 A1* | 11/2004 | Hirano et al. | 257/758 |
| 2006/0019505 A1 | 1/2006 | Cooper et al. | |
| 2006/0197181 A1 | 9/2006 | Noguchi | |
| 2006/0220227 A1 | 10/2006 | Marro | |
| 2008/0099909 A1* | 5/2008 | Baek | H01L 23/427 257/715 |

(Continued)

FOREIGN PATENT DOCUMENTS

| | | |
|---|---|---|
| JP | H01295455 A | 11/1989 |
| JP | 2000-306998 A | 11/2000 |

(Continued)

OTHER PUBLICATIONS

International Search Report & Written Opinion for PCT Application No. PCT/US2011/026987, dated Jun. 29, 2011.

(Continued)

*Primary Examiner* — Thao X Le
*Assistant Examiner* — Geoffrey Ida
(74) *Attorney, Agent, or Firm* — Volpe and Koenig, P.C.

(57) ABSTRACT

In a stack of chips which each include active circuit regions, a plurality of through-silicon via (TSV) structures are formed for thermally conducting heat from the multi-chip stack by patterning, etching and filling with thermally conductive material a plurality of TSV openings in the multi-chip stack, including a first larger TSV opening that extends through substantially the entirety of the multi-chip stack without penetrating any active circuit region, and a second smaller TSV opening that extends down to but not through an active circuit region.

19 Claims, 4 Drawing Sheets

(56) References Cited

U.S. PATENT DOCUMENTS

| | | | |
|---|---|---|---|
| 2009/0053858 A1* | 2/2009 | Ko et al. .................. | 438/118 |
| 2009/0109624 A1 | 4/2009 | Chan et al. | |
| 2009/0160531 A1 | 6/2009 | Law et al. | |
| 2009/0180257 A1 | 7/2009 | Park et al. | |
| 2010/0176506 A1* | 7/2010 | Hsu et al. ................ | 257/698 |
| 2010/0187670 A1* | 7/2010 | Lin et al. ................. | 257/686 |
| 2011/0115955 A1 | 5/2011 | Okutani et al. | |

FOREIGN PATENT DOCUMENTS

| | | |
|---|---|---|
| JP | 2005059269 | 3/2005 |
| JP | 2008182127 | 7/2008 |
| JP | 2009246258 A | 10/2009 |
| WO | 2005087652 A1 | 9/2005 |

OTHER PUBLICATIONS

International Preliminary Report on Patentability for PCT Application No. PCT/US2011/026987, dated Sep. 13, 2012.
A. Jourdain et al., Electrically Yielding Collective Hybrid Bonding for 3D Stacking of ICs, 2009 Electronic Components and Technology Conference, pp. 11-13.
M. Puech et al., DRIE for Through Silicon Via, http://www.emc3d.org/documents/library/technical/Alcatel%20DRIE-TSV%20Micromachining%20Systems_europe.pdf, 2007.
H. Yu et al., Dynamic Power and Thermal Integrity in 3D Integration, http://eda.ee.ucla.edu/pub/C129.pdf, Jul. 23-25, 2009.

* cited by examiner

DUMMY TSV TO IMPROVE PROCESS UNIFORMITY AND HEAT DISSIPATION

BACKGROUND OF THE INVENTION

Field of the Invention

The present invention relates in general to integrated circuits. In one aspect, the present invention relates to stacked semiconductor die devices and a method for designing and manufacturing same.

Description of the Related Art

The semiconductor industry has traditionally pursued higher density of circuits (e.g., analog, memory, CPU, graphics, etc.) and electronic components (i.e., transistors, diodes, resistors, capacitors, etc.) by reducing the required two-dimensional (2D) chip area for integrated circuit components. However, there is increasing interest in developing three-dimensional (3D) integrated circuits to achieve higher device density by bonding two or more layers of circuit substrates or wafers into a stacked die architecture. 3D packaging architectures, including stacked die architectures, can provide higher circuit density over 2D packaging architectures, and can also improve performance by reducing interconnect distances between circuits located on different levels of the stacked die. For example, with 2D systems-on-chip (SoC) integration where the memory is surrounded by logic circuits, system performance in terms of memory bandwidth is limited by a number of factors, such as the length of long interconnects, the number of interface pads on a mother die, etc. But with 3D integration, the physical distance between the memory and the logic circuits is reduced. However, there are design challenges presented when large numbers of devices are densely packed into stacked device layers, such as heat removal, power delivery, and fabrication processing.

Accordingly, a need exists for an improved system for designing and manufacturing stacked semiconductor die devices which addresses various problems in the art that have been discovered by the above-named inventor where various limitations and disadvantages of conventional solutions and technologies will become apparent to one of skill in the art after reviewing the remainder of the present application with reference to the drawings and detailed description which follow, though it should be understood that this description of the related art section is not intended to serve as an admission that the described subject matter is prior art.

SUMMARY OF THE INVENTION

Broadly speaking, the present invention provides a system, method and apparatus for allocating and forming through-silicon-via (TSV) structures in stacked semiconductor die devices by forming shallow "dummy" TSV structures (aka, partial TSVs or PTSVs) in areas above (or below) active circuit areas, thereby resulting in a more uniform distribution of "dummy" and "real" TSVs to improve heat removal and/or processing uniformity. In selected embodiments, the etching process is controlled to form the "dummy" and "real" TSVs at different depths by making the feature size of the "dummy" TSV structures smaller than the feature size of the "real" TSV structures. The differing depths of TSV structures results from the fact that the etching ratio of a structure is different depending on a feature size. In short, a larger feature size results in a deeper TSV depth than would result from a smaller feature size for a given etch process. With this approach, dummy TSV structures of the appropriate depth may be positioned over (or below) a specified active circuit at a predetermined device layer in the 3D stacked integrated circuit so that the dummy TSV structures reach to within a few microns of the specified active circuit, but without reaching the other side (front side) of the silicon. The positioning of the dummy TSV structures in close proximity to the specified active circuit improves heat dissipation as compared to using only TSV structured outside of the active areas. The presence of additional (smaller) dummy TSVs will improve process uniformity and stability since TSVs can be located wherever they are needed, regardless of a presence of active circuit or not at the other side of silicon without having any additional processing steps.

In selected example embodiments, a multi-chip stack device and fabrication methodology are provided for forming a plurality of chips into a multi-chip stack, where each chip includes one or more active circuit regions and one or more inactive circuit regions. In selected embodiments, the multi-chip stack is formed by assembling or bonding a first or upper wafer (in which is formed multiple chips and arrayed TSV structures) to a second or lower wafer (in which is formed multiple chips and arrayed TSV structures) such that, when assembled, the chips and arrayed TSV structures are aligned to form combined TSV structures in the different wafer levels that extend down to, but not through, active circuit regions in each level. In other embodiments, the multi-chip stack is formed by assembling or bonding one or more stacked chips to a first wafer (in which is formed one or more chips and arrayed TSV structures), where each stacked chip includes one or more arrayed TSV structures that are aligned in the multi-chip stack to form combined TSV structures in the different chip levels that extend down to, but not through, active circuit regions in each chip level. In yet other embodiments, individual chips having circuit area(s) and arrayed TSV structures may be assembled or bonded into a multi-chip stack such that the arrayed TSV structures in the multi-chip stack are aligned to form combined TSV structures in the different chip levels that extend down to, but not through, active circuit regions in each chip level. In a first wafer or chip level where one or more active circuits are formed, the arrayed TSV structures may be formed by patterning and etching a plurality of through-silicon via (TSV) openings, including a first TSV opening that extends through the entirety of the wafer or chip level without penetrating any active circuit region, and a second TSV opening that extends down to but not through an active circuit region. The pattern and etch process may be implemented by depositing a photoresist layer over the wafer, patterning and etching the photoresist layer to form an etch mask comprising the first TSV opening that is larger than the second TSV opening, and selectively etching the wafer using the etch mask to extend the first TSV opening through the entirety of the wafer level without penetrating any active circuit region, and to extend the second TSV opening to extend down to but not through an active circuit region. In each wafer level, the TSV openings may then be filled with one or more conductive layers, and an additional conductive contact layer may optionally be formed over each filled TSV opening to facilitate contact between TSV structures in different wafer/chip levels when the wafers/chips are aligned and attached or connected to one another. In the wafer or chip level(s) above the first wafer or chip level, TSV structures are formed (e.g., by patterning, etching and filling TSV openings) in alignment with the underlying TSV structures to provide electrical and/or thermal via conduits through the upper wafer levels. In other embodiments, the TSV structures may be formed by patterning and etching a first plurality of TSV openings that extend through substantially the entirety of the multi-chip stack without penetrating any active circuit region, patterning and etching a second plurality of TSV openings that extend down to but not through an active circuit region, and then filling the TSV openings with one or more deposited conductive layers to form TSV structures for thermally conducting heat from the multi-chip stack, such as by electroplating copper into the plurality of TSV openings. As formed, the plurality of TSV structures may be substantially uniformly distributed across the multi-chip stack to form thermal/electrical via conduits in thermal contact with a heat sink formed on the multi-chip stack device.

In other embodiments, a method of fabricating an integrated circuit having a plurality of device layers is described. In the disclosed methodology, a first wafer substrate (e.g., a silicon wafer substrate layer) having a plurality of chip areas is provided, where each chip area includes one or more active circuit regions formed on a first side of the first wafer substrate. In each of the chip areas, thermally/electrically conductive through-silicon via structures are formed to include a first thermally/electrically conductive through-silicon via structure (which extends through the first wafer substrate without penetrating any of the one or more active circuit regions) and a second thermally conductive through-silicon via structure (which extends partially through the first wafer substrate without penetrating any active circuit region in the first wafer substrate). The thermally conductive through-silicon via structures may be formed by selectively etching openings in the chip areas on a second side of the first wafer substrate, including a first opening positioned outside any active circuit region that extends through the first wafer substrate, and a second opening positioned over the active circuit region that extends partially through the first wafer substrate toward the one or more active circuit regions in the first wafer substrate. The selective etch process may include depositing, patterning and etching a photoresist layer over the second side of the first wafer substrate to form an etch mask with a first pattern opening for the first through-silicon via opening that is larger than a second pattern opening for the second through-silicon via opening; followed by anisotropically etching the first wafer substrate using the etch mask to extend the first through-silicon via opening through the first wafer substrate without penetrating any active circuit region, and to extend the second through-silicon via opening partially through the first wafer substrate without extending through any of the one or more active circuit regions. In the etch mask the first pattern openings may be positioned outside of the active circuit regions to align with any thermally conductive through-silicon via structures formed in a second wafer substrate that is bonded to the first side of the first wafer substrate. In the selectively etched openings, one or more conductive layers are deposited (e.g., by electroplating copper) to form the first and second thermally conductive through-silicon via structures. In connection with forming the first wafer substrate, a second wafer substrate having a plurality of chip areas with active circuit regions on a first side may also be provided, where the second wafer substrate includes a first set of thermally/electrically conductive through-silicon via structures in each chip area which extend through the second wafer substrate and are positioned for alignment with a corresponding first thermally/electrically conductive through-silicon via structure in the first wafer substrate. By bonding a second side of the second wafer substrate to the first side of first wafer substrate, each of the first set of thermally/electrically conductive through-silicon via structures in the second wafer substrate is aligned to contact a corresponding first thermally/electrically conductive through-silicon via structure in the first wafer substrate. In addition or in the alternative, a third wafer substrate having a plurality of chip areas and active circuit regions on a first side may be provided, where the third wafer substrate includes a second set of thermally conductive through-silicon via structures in each chip area which extend only partially through the third wafer substrate and are positioned for alignment with a corresponding first thermally/electrically conductive through-silicon via structure in the first wafer substrate. By bonding a second side of the third wafer substrate to the first side of first wafer substrate, each of the second set of thermally conductive through-silicon via structures in the third wafer substrate is aligned to contact a corresponding first thermally/electrically conductive through-silicon via structure in the first wafer substrate. Finally, a fourth wafer substrate having a plurality of chip areas with active circuit regions formed on a first side may be provided, where the fourth wafer substrate includes a third set of thermally/electrically conductive through-silicon via structures in each chip area which extend through the fourth wafer substrate so that, when the first side of the fourth wafer substrate is bonded to the second side of first wafer substrate, each of the first and second thermally conductive through-silicon via structures in the first wafer substrate is aligned to contact a corresponding one of the third set of thermally conductive through-silicon via structures in the fourth wafer substrate.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

Figure 1:
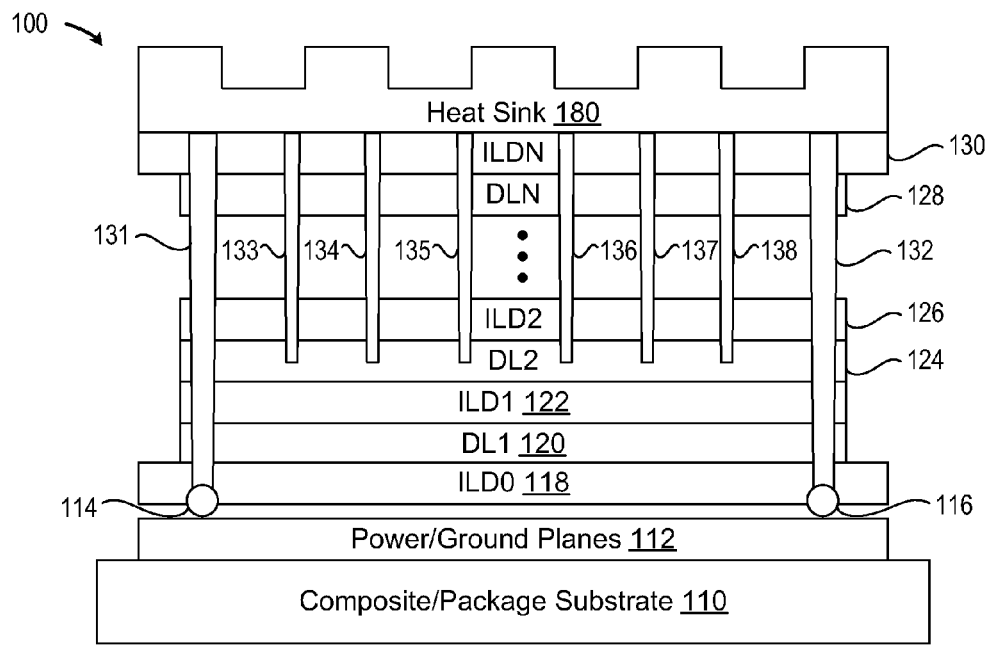
FIG. 1 illustrates a cross sectional view of a package structure including stacked dies in which there are formed through-silicon-via structures of different depths.

A 3D wafer or die packaging architecture and fabrication methodology are described for forming partial or "dummy" through-silicon-via (TSV) structures to provide better TSV etching process margin and stability and enhanced heat dissipation. At the same time that regular TSV openings are etched in a specified wafer layer to extend through the wafer layer, dummy TSV openings may be formed to a partial depth in the specified wafer layer by using smaller patterned openings to etch the dummy TSV openings, resulting in deeper regular TSV openings and shallower dummy TSV openings. These openings are then filled with one or more conductive materials to form regular and dummy TSV structures in the specified wafer layer to reduce effective thermal resistances. By properly controlling the spacing and sizing of the patterned openings in relation to the underlying active circuit areas in the stacked dies, dummy TSV structures may be formed above active circuit areas in the specified wafer layer since they extend only partway through the specified wafer layer, stopping just short of an active circuit area at a given die level. In the wafer or chip level(s) above the specified wafer layer, TSV structures are formed (e.g., by patterning, etching and filling TSV openings) in alignment with the underlying TSV structures to provide thermal/electrical via conduits through the upper wafer or chip level(s). The resulting improvement in TSV distribution enhances heat dissipation from the stacked die since dummy TSVs can be located wherever they are needed, regardless of a presence of active circuit or not at the other side of silicon, all without having any additional processing steps. In addition, the improved TSV distribution improves process uniformity and stability. Such heat dissipation and process uniformity advantages may advantageously be applied in any products employing stacked stacked die architectures, including but not limited to graphics and CPU chips which use TSV technology.

Various illustrative embodiments of the present invention will now be described in detail with reference to the accompanying figures. While various details are set forth in the following description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are shown in block diagram form, rather than in detail, in order to avoid limiting or obscuring the present invention. In addition, selected aspects are depicted with reference to simplified cross sectional drawings of a semiconductor device without including every device feature or geometry in order to avoid limiting or obscuring the present invention. Such descriptions and representations are used by those skilled in the art to describe and convey the substance of their work to others skilled in the art. In addition, although specific example materials are described herein, those skilled in the art will recognize that other materials with similar properties can be substituted without loss of function. It is also noted that, throughout this detailed description, certain materials will be formed and removed to fabricate the semiconductor structure. Where the specific procedures for forming or removing such materials are not detailed below, conventional techniques to one skilled in the art for growing, depositing, removing or otherwise forming such layers at appropriate thicknesses shall be intended. Such details are well known and not considered necessary to teach one skilled in the art of how to make or use the present invention.

Referring now to FIG. 1, there is shown a partial cross-sectional view of a package structure 100 including stacked dies 120, 124, 128 which are separated from one another by interlayer dielectric layers 118, 122, 126, 130 and contained within a package that includes a composite/package substrate 110, a heat sink structure 180 and one or more encapsulant layers (not shown). As will be appreciated, each interlayer dielectric layer (e.g., 118) may be formed from one or more constituent dielectric layers which are used to form a multi-metal layer contact stack and may also include one or more dielectric glue layers used to adhere one device layer to another device layer. In addition, any desired technique may be used to form the stacked dies 120, 124, 128, including but not limited to die-to-wafer bonding techniques wherein a plurality of individual dies or device levels 120, 124, 128 are bonded to a same wafer, wherein each of the dies or device levels 120, 124, 128 includes active integrated circuits. Though not explicitly shown, the signal and reference supply/voltages are delivered from the bottom power/ground planes 112 in the package, passed through vias and connection pads or bumps, and connected to the on-chip power/ground grid on active device layers DL1 120, DL2 124 and DLN 128. While there are "N" device layers shown, it will be appreciated that the 3D integration includes two or more layers of active circuits or devices which can draw much larger current from package power/ground planes than 2D integrated circuits, resulting in excessively high temperature that can significantly degrade the reliability and performance. Thus, the increased device and power density of 3D die packaging architectures places a significant heat removal burden in on the package structure 100, especially given the slow heat-convection properties of the inter-layer dielectrics 118, 122, 126, 130 and any insulating glue layer(s) contained therein.

To dissipate heat, the package structure 100 includes through-silicon-via structures 131-138 of different depths in accordance with selected embodiments of the present invention. For a specified device layer (e.g., device layer DL2 124) having TSV structures formed to different depths, the etching process applied to the specified device layer (and any overlying dielectric layer(s)) is controlled to form the TSVs at different depths by making the feature size of the short TSV structures (e.g., 133-138) smaller than the feature size of the full length TSV structures (e.g., 131, 132). The differing depths of TSV structures results from the fact that the etching ratio of a structure is different depending on a feature size. The specified device layer (e.g., 124) may then be aligned with, and attached to, the other stacked device layers (e.g., 118/120/122 and 126/128/130) which each have their own separately formed TSV structures that are aligned in the stacked structure to form combined TSV structures in the different wafer levels that extend down to, but not through, active circuit regions in each level. In this way, the TSV structures 131-138 are formed to convey heat to the heat-sink structure 180 at the top of the package structure 100 as the primary heat removal path to the ambient air. While TSV structures 131, 132 are typically formed through the entire depth of the package structure to extract heat from each and every device layer 120, 124, 128, the depth of such structures prevents them from being formed over any active circuit area in an underlying device layer. As a consequence, regular TSV structures 131, 132 are only formed outside of active circuit areas (e.g. at the periphery of the package structure 100), thereby reducing the effective heat dissipation function for device layer regions in the package structure 100 where there are active circuit areas. To improve heat dissipation in the package structure 100, one or more additional "dummy" TSV structures 133-138 are also formed at different or shallower depths to avoid penetration through underlying active circuit areas, thereby allowing the shallower dummy TSVs to be located wherever they are needed regardless of a presence of active circuit or not at the other side of silicon.

Though shown in simplified form, it will be appreciated that each portion of the TSV structures 131-138 in a specified device level may be aligned and connected with other portions of the TSV structures 131-138 in other device levels. In addition, each portion of the TSV structures 131-138 in a specified device level may include constituent interconnect features (such as conductive contacts, pads, metal lines and via structures) that are formed in the course of fabricating each separate device level prior to alignment and connection of the separate device levels into the stacked structure 118, 120, 122, 124, 126, 128, 130. Alternatively, all or part of the TSV structures 131-138 may be formed with the same processing steps by assembling or bonding the stacked wafer dies 118, 120, 122, 124, 126, 128, 130 into a single integrated 3D structure and the applying a patterned etch process which defines dummy TSV openings 133-138 which are smaller in size than the active or regular TSV openings 131-132 such that the dummy TSV openings 133-138 do not reach other side (front side) of any device layer 120, 124, 128 in any region where there is an active circuit area. While any desired patterned etch process can be used to form the TSV structures 131-138 to have different depths, selected embodiments of the present invention employ a photolithography and/or selective etch technique at each specified device level where the TSVs of different depths are to be formed by depositing and patterning a protective mask or photoresist layer over the a specified device layer and/or interlayer dielectric layer to define openings for the dummy TSVs that are smaller than the openings for the regular TSVs. By applying an anisotropic etch process to the mask/photoresist layer, the size of the patterned openings will control the etching rate or aspect ratio of the etched feature or opening, which in turn controls the depth of the TSV opening so that a larger TSV pattern opening will result in a deeper etched feature, while a smaller TSV pattern opening will result in a shallower etched feature. With the different sized openings defined in the protective mask/photoresist layer (not shown), one or more anisotropic etch processes (e.g., reactive ion etching) may be applied to form the openings for the (deeper) regular TSVs and (shallower) dummy TSVs, depending on the type of material(s) being etched. In the openings formed in each device level, TSV structures may then be formed with one or more layers or suitable conductive material (e.g. copper), such as by chemical vapor deposition (CVD), sputtering, physical vapor deposition (PVD), electro-plating, electroless plating, or the like.

Figure 2:
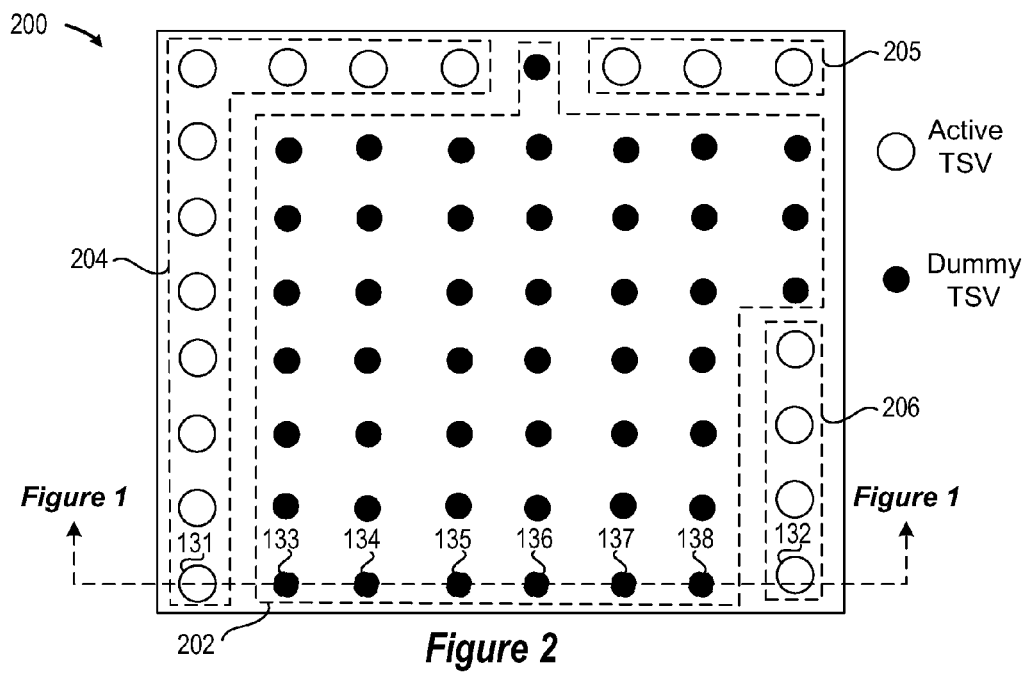
FIG. 2 illustrates an example TSV distribution layout of patterned openings for forming the through-silicon-via structures shown in FIG. 1.

By allowing shallow dummy TSVs to be formed anywhere over the stacked structure to predetermined depths simply by controlling the spacing and sizing of the patterned openings, dummy TSV structures may be formed inside the stacked chip area and over active circuit areas since they extend only partway through the stacked chips, stopping just short of an active circuit area at a given die level. An example TSV distribution layout of patterned openings 200 is shown in FIG. 2 for forming the through-silicon-via structures 131-138 in at least device layer DL2 124 shown in FIG. 1. As illustrated, the patterned openings include smaller openings (in region 202) and larger openings (in regions 204-206). With the smaller openings formed in region 202, the applied etch process creates shallower TSV openings that are plated or filled to form dummy TSV openings 133-138 in the central area of device layer DL2 124, and simultaneously form deeper TSV openings that are plated or filled to form active TSV openings 131-132 in the peripheral areas of device layer DL2 124.

By properly controlling the spacing and sizing of the patterned openings in relation to the underlying active circuit areas during fabrication of each of the die levels, dummy TSV structures may be formed inside the stacked chip area that extend only partway through the stacked chips, stopping just short of an active circuit area at a given die level. To illustrate an example implementation of how the dummy TSV structures can be controlled in relation to the underlying active areas, reference is now made to FIG. 3 which illustrates a cross sectional view of a package structure 300 which includes stacked die layers 320, 324, 328 separated from one another by interlayer dielectric layers 318, 322, 326, 330 and contained within a package that includes a composite/package substrate 310, a heat sink structure 380 and one or more encapsulant layers (not shown). In each of the stacked dies 320, 324, 328, there are one or active areas A1, A2, AN formed in predetermined regions, as shown in FIG. 4 which illustrates in perspective view the locations of the active areas A1, A2, AN in each die level 320, 324, 328. FIG. 4 also illustrates a series of etch masks 400, 500, 600 which are used to define TSV distribution layouts of patterned openings at each device level 320, 324, 328, respectively.

To illustrate an example fabrication sequence, a first etch mask 400 may be used to etch TSV openings in the first die level 320 that will be used to form part of the TSV structures 340-342 and 350-351. In areas of the first die level 320 where there are no active circuit areas co-located in any other device level (e.g., outside of the A1, A2, and AN areas), the mask 400 includes a first set of pattern openings (e.g., 440-442) that are defined at a first relatively large size that is sufficient to etch completely through the first die level 320. However, in areas of the first die level 320 where active circuit areas are located (e.g., in the A1 area), the mask 400 includes a second set of smaller pattern openings (e.g., 450, 451) that are defined to limit the depth of the TSV structures formed over the A1 circuit area. When the mask 400 is applied to the first die level 320 (and any interlayer dielectric layers formed thereon), an anisotropic etch process that is applied to the etch mask 400 results in full depth TSV openings where the first set of pattern openings (e.g., 440-442) are formed, and in partial depth TSV openings where the second set of smaller pattern openings (450, 451) are formed. By controlling the relative size of the second set of pattern openings, the anisotropic etch process is constrained to etch openings that extend to within a predetermined distance (e.g., a few microns) of the active circuit area A1.

In similar fashion, the next die level 324 is patterned and etched using a second etch mask 500 to define TSV openings that will be used to form part of the TSV structures 340-342, 350-351, and 360-361. The second etch mask 500 includes a first set of pattern openings (e.g., 540-542 and 550-551) which align with the first and second set of pattern openings (e.g., 440-442 and 450-451) and which are defined at a first relatively large size that is sufficient to etch completely through the second die level 324. In addition, the second etch mask 500 includes a second set of smaller pattern openings (e.g., 560, 561) in areas of the second die level 324 where active circuit areas are located (e.g., in the A2 area), where the smaller pattern openings are defined to limit the depth of the TSV structures formed over the A2 circuit area. In this way, an anisotropic etch process that is applied to the etch mask 500 results in full depth TSV openings where the first set of pattern openings (e.g., 540-542 and 550-551) are formed, and in partial depth TSV openings where the second set of smaller pattern openings (560, 561) are formed since the smaller size of the second set of pattern openings constrains the anisotropic etch process to etch openings that extend to within a predetermined distance (e.g., a few microns) of the active circuit area A1.

Finally, the last die level 328 may be patterned and etched using a third etch mask 600 to define TSV openings that will be used to form part of the TSV structures 340-342, 350-351, 360-361, and 370-373. The third etch mask 600 includes a first set of pattern openings (e.g., 640-642, 650-651, and 660-661) which align with the first and second set of pattern openings (e.g., 540-542, 550-551, and 560-561) and which are defined at a first relatively large size that is sufficient to etch completely through the last die level 328. In addition, the third etch mask 600 includes a second set of smaller pattern openings (e.g., 670-673) in areas of the third die level 328 where active circuit areas are located (e.g., in the AN area), where the smaller pattern openings are defined to limit the depth of the TSV structures formed over the AN circuit area. In this way, an anisotropic etch process that is applied to the etch mask 600 results in full depth TSV openings where the first set of pattern openings (e.g., 640-642, 650-651, and 660-661) are formed, and in partial depth TSV openings where the second set of smaller pattern openings (670-673) are formed since the smaller size of the second set of pattern openings constrains the anisotropic etch process to etch openings that extend to within a predetermined distance (e.g., a few microns) of the active circuit area AN.

Figure 3:
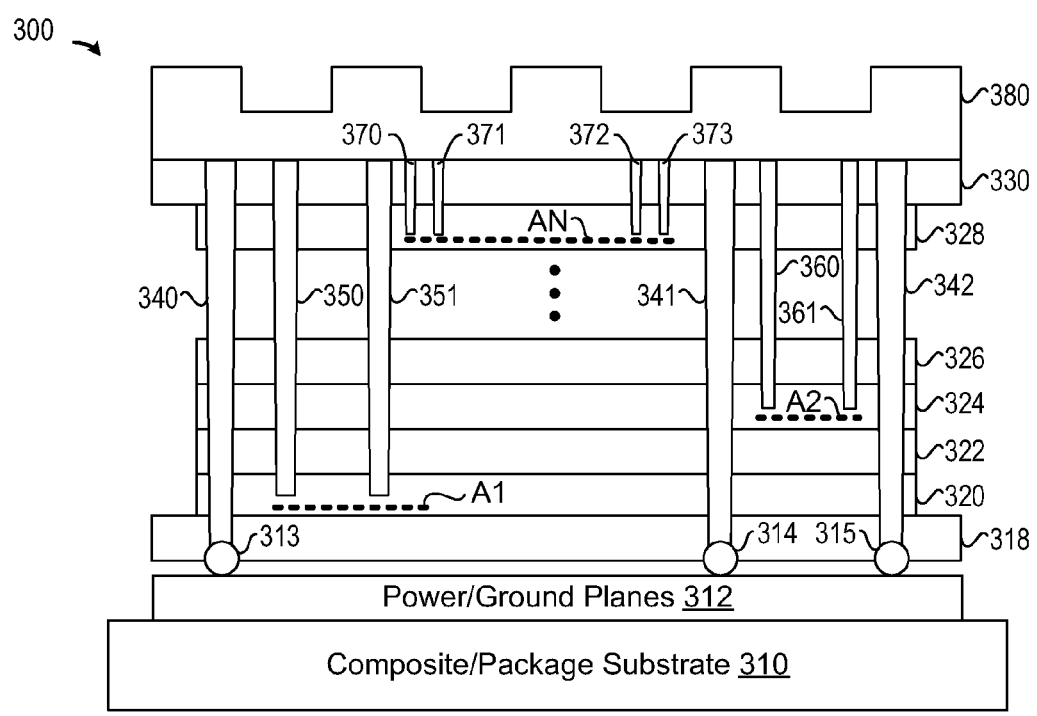
FIG. 3 illustrates a cross sectional view of a package structure including stacked dies in which through-silicon-via structures are formed to different depths based on the location of active areas in each die level.
Figure 4:
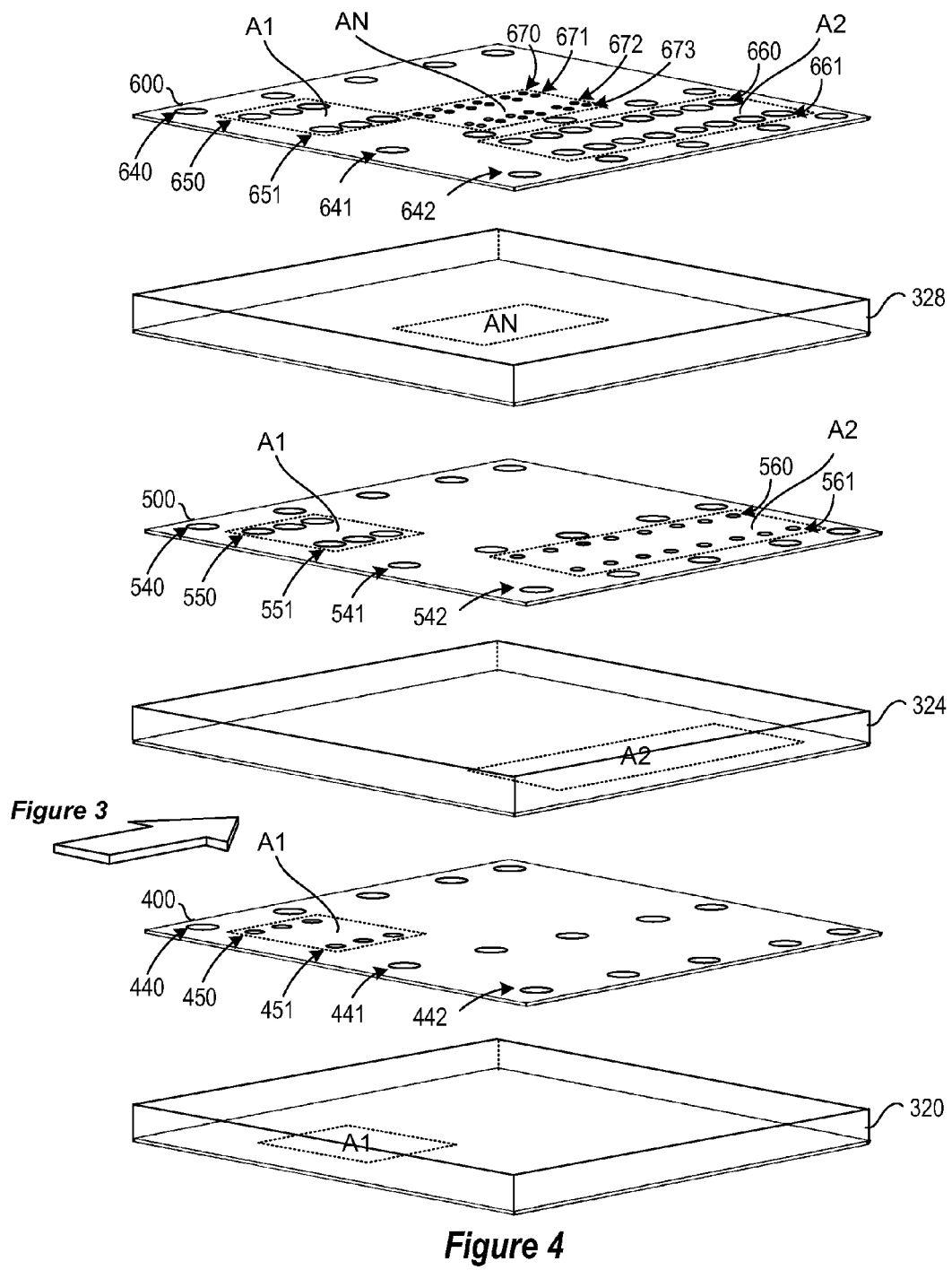
FIG. 4 illustrates in perspective view the locations of the active areas in each die level and how they are merged to define different an etch mask for each die level with TSV distribution layouts of patterned openings for forming the through-silicon-via structures shown in FIG. 3.

After using the etch masks 400, 500, 600 to etch openings in the different die levels 320, 324, 328, the openings in each die level are filled with one or more conductive layers, and the die levels are then combined into a stacked device having TSV structures 340-342, 350-351, 360-361, 370-373 that are formed to different depths based on the location of active areas A1, A2, AN shown in FIG. 3. As illustrated, in areas of the stacked dies where there are no active circuit areas located (e.g., outside of the A1, A2, and AN areas), full depth TSV structures (e.g., 340-342) are formed that extend through the entirety of the stacked die. However, in the area of the stacked dies over the active circuit area A1 in the first device level 320, partial depth TSV structures (e.g., 350-351) are formed that extend to within a predetermined distance (e.g., a few microns) of the active circuit area A1 in the first device level 320. In similar fashion, over the active circuit area A2 in the second device level 324, partial depth TSV structures (e.g., 360-361) are formed that extend to within a predetermined distance of the active circuit area A2 in the second device level 324, and over the active circuit area AN in the Nth device level 328, partial depth TSV structures (e.g., 370-373) are formed that extend to within a predetermined distance of the active circuit area AN in the Nth device level 328.

By forming the TSV structures to different depths based on the location of active areas A1, A2, AN in each die level 320, 324, 328, better heat dissipation is achieved for conducting heat to the heat-sink structure 380 formed at the top of the package structure 300. Of course, it will be appreciated that the TSV structures of different depths can be located and placed in a variety of different ways to avoid penetrating the underlying active circuit areas. In addition to improving heat dissipation, the additional dummy or partial TSV structures also provide better TSV etching process margin and stability by improving the uniformity of TSV distribution. When patterned etch openings are not uniformly distributed, different etch rates and depths can result due to loading effects. However, by providing a way to include additional dummy or partial TSV structures, the patterned etch openings are more uniformly distributed, etch processes achieve more uniform etching rates across a given area, resulting in improved stability and performance for the TSV manufacturing process.

Figure 5:
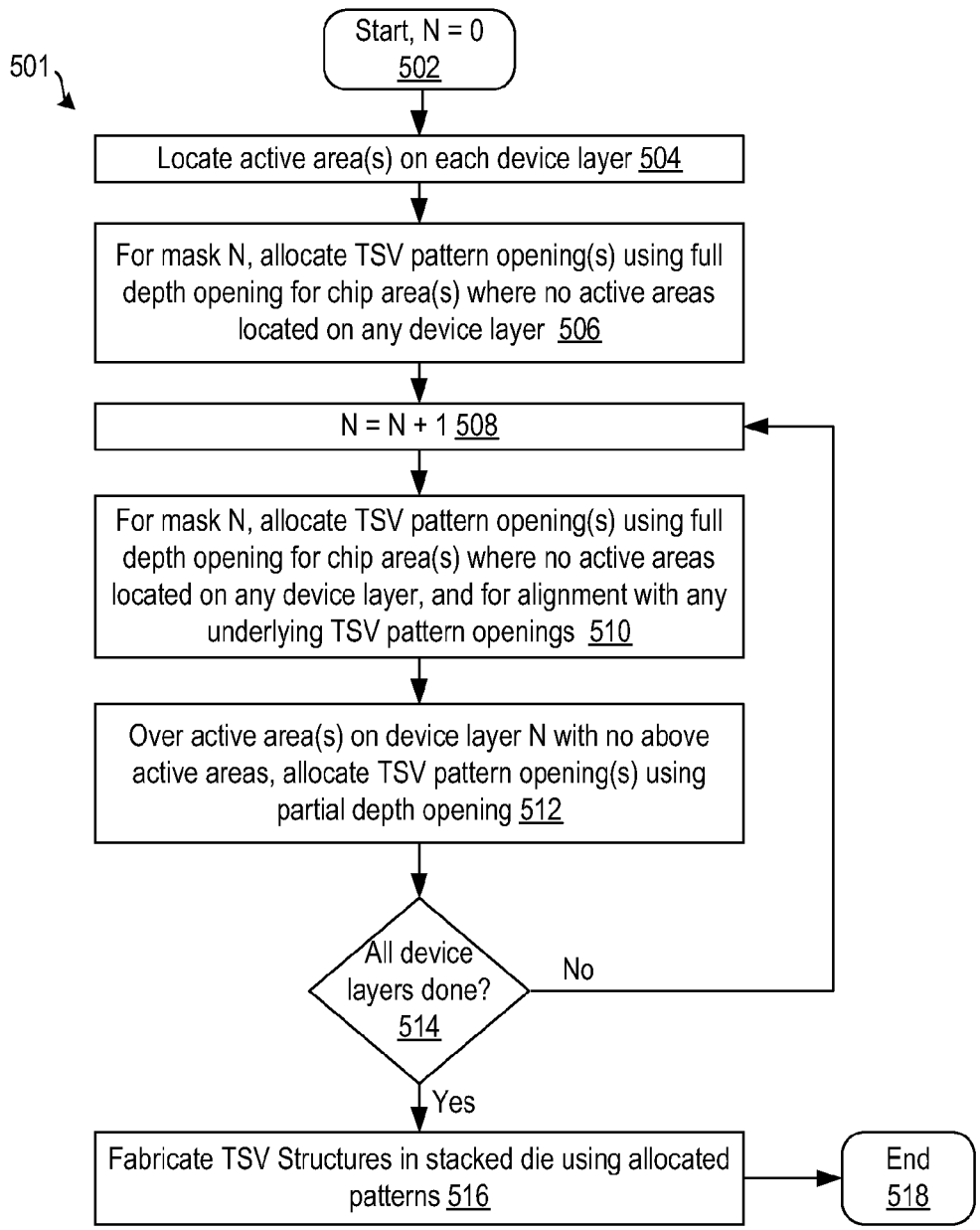
FIG. 5 illustrates a flow diagram for a design and manufacturing sequence for allocating a pattern of TSV and PTSV openings in accordance with selected embodiments of the present invention.

FIG. 5 illustrates a flow diagram for a design and manufacturing sequence 501 for allocating a pattern of full depth and partial depth pattern openings in a plurality of masks that are used to fabricate TSV structures in a stacked die in accordance with selected embodiments of the present invention. The sequence begins at step 502 during an initial design phase. At this point, the locations for the various TSV structures have not been defined, as indicated by the initial value N=0.

At step 504, the layout patterns for the active circuit areas in each device level of the stacked IC device are retrieved and located within the overlapping area of the stacked device levels. For example, if three device levels D1, D2, DN are included in a stacked device, any active area (e.g., A1) in the first device level DL1 is located or determined with reference to the overlapping area of the stacked device levels. In similar fashion, any active areas A2, AN in the second device level DL2 or Nth device level, respectively, are located or determined with reference to the overlapping area of the stacked device levels. As will be appreciated, once the active area(s) in the overlapping area are located for all device levels, it is known which portions of the overlapping area have no active areas.

At step 506, a TSV pattern of openings is allocated for a first mask that is used to fabricate the first device layer. In the first mask, TSV pattern openings having a full depth opening size are allocated for any part of the overlapping chip area where there are no active areas located in any device layer. As will be appreciated, any allocation pattern may be used, though in selected embodiments, the allocation pattern provides a uniform pattern of allocated openings in the designated chip area. In accordance with selected embodiments, the full depth opening size is determined in light of the applicable process flow (e.g., applicable layer materials and thicknesses, type of etch chemistry used, etc.) so that, given a particular etch process used to form the TSV openings during fabrication, the depth of the openings extend through the entirety of the device layer.

Beginning at step 508, the pattern allocation process for the next device layer begins by incrementing the device layer count N=N+1. For this next level, a TSV pattern of openings is allocated for a second mask that is used to fabricate the new device layer. At step 510, TSV pattern openings having a full depth opening size are allocated in the second mask for any part of the overlapping chip area where there are no active areas located in any device layer. In addition, full depth TSV pattern openings are allocated in the second mask to align with any underlying TSV pattern openings. At step 512, TSV pattern openings having a partial depth opening size are allocated for mask N over any active area(s) on device layer N with no above active areas. The size of the partial depth opening is selected in light of the applicable process flow (e.g., applicable layer materials and thicknesses, type of etch chemistry used, etc.) so that, given a particular etch process used to form the TSV openings during fabrication, the depth of the openings will extend down to, but not through, the active area(s) in the Nth device layer. Again, any allocation pattern may be used.

At step 514, the sequence determines if the masks for all device layers have been allocated. If not (negative outcome to decision 514), the sequence loops back to start the pattern allocation process for the next device layer by incrementing the device layer count N (step 508) and then allocating the TSV patterns of full depth and partial depth openings in the mask for the next device layer N (steps 510, 512). This loop continues until the patterned openings for all of the device levels have been allocated (affirmative outcome to decision 514), at which point, the sequence proceeds to fabricate the TSV structures in the stacked die using the allocated patterns (step 516), and the sequence ends (step 518).

By now, it will be appreciated that there has been disclosed a multi-layer integrated circuit and method for making same. As disclosed, the integrated circuit is formed to have a plurality of device layers. A first substrate device layer has first and second sides, where a first active circuit area is formed on the second side. The first substrate device layer also includes a first set of thermally/electrically conductive through-silicon via structures which extend through the first substrate layer without penetrating the first active circuit area, and a second set of thermally conductive through-silicon via structures which extend only partially through the first substrate layer for conducting heat from the first active circuit area. A first dielectric layer is formed over the first side of the first substrate layer, and includes a third set of thermally/electrically conductive through-silicon via structures which extend through the first dielectric layer and align with the first and second sets of thermally conductive through-silicon via structures. A second substrate device layer having first and second sides is formed over the first dielectric layer with a second active circuit area formed on the second side. The second substrate device layer includes a fourth set of thermally/electrically conductive through-silicon via structures which extend through the second substrate layer for alignment with the third set of thermally/electrically conductive through-silicon via structures in the first dielectric layer, and also includes a fifth set of thermally conductive through-silicon via structures which extend only partially through the second substrate layer for conducting heat from the second active circuit area. Finally, the integrated circuit includes a heat sink that is formed over the second substrate layer to be in thermal contact with the first, second, third, fourth and fifth sets of thermally conductive through-silicon via structures.

Although the described exemplary embodiments disclosed herein are directed to various stacked semiconductor device structures and methods for making same, the present invention is not necessarily limited to the example embodiments which illustrate inventive aspects of the present invention that are applicable to a wide variety of semiconductor processes and/or devices. Thus, the particular embodiments disclosed above are illustrative only and should not be taken as limitations upon the present invention, as the invention may be modified and practiced in different but equivalent manners apparent to those skilled in the art having the benefit of the teachings herein. For example, the TSV and dummy or partial TSV structures may be defined with different shapes, relative dimensions and patterning layout arrangements than shown. In addition, the TSV and dummy or partial TSV structures may be formed with a single etch sequence by forming one etch mask with different pattern opening sizes that are selected to control the final depth of the etched opening to extend down to, but not through, any underlying active circuit area. There are also different ways to form the multi-chip stacks, including but not limited to stacking wafers which each include full depth and partial depth TSV structures, followed by singulation of the wafer stack into multi-chip stacks, or stacking individual chips with defined TSV structures onto a wafer or individual chip with defined TSV structures, followed by singulation of the assembly into multi-chip stacks. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

Accordingly, the particular embodiments disclosed above are illustrative only and should not be taken as limitations upon the present invention, as the invention may be modified and practiced in different but equivalent manners apparent to those skilled in the art having the benefit of the teachings herein. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

What is claimed is:

1. A method of forming at least a first integrated circuit for use in assembling a multi-chip stack, the method comprising:
   patterning and etching a first plurality of through-silicon via openings in a first wafer, the first wafer having a first side and a second side, the first plurality comprising:
   at least a first through-silicon via opening that extends entirely through the first wafer from an opening in the first side to an opening in the second side without contacting any active circuit formed in the first wafer, and
   at least a second through-silicon via opening that extends partially through the first wafer along a path, the path extending from the first side through an active circuit formed in the first wafer to the second side, wherein the second through-silicon via opening does not contact and does not penetrate any active circuit formed in the first wafer; and
   forming one or more conductive layers in the first plurality of through-silicon via openings to form a first plurality of through-silicon via structures in the first wafer for thermally conducting heat.

2. The method of claim 1, further comprising bonding a second wafer to the first wafer in which is formed the first plurality of through-silicon via structures such that at least one of second plurality of through-silicon via structures formed in the second wafer is aligned to contact at least one of the first plurality of through-silicon via structures in the first wafer.

3. The method of claim 1, wherein patterning and etching the first plurality of through-silicon via openings comprises patterning and etching the first plurality of through-silicon via openings in at least a first dielectric layer formed on the first wafer.

4. The method of claim 1, wherein patterning and etching the first plurality of through-silicon via openings comprises:
depositing a photoresist layer on the first wafer;
patterning and etching the photoresist layer to form an etch mask for the first wafer comprising a first pattern opening for the first through-silicon via opening that is larger than a second pattern opening for the second through-silicon via opening; and
selectively etching the first wafer using the etch mask to extend the first through-silicon via opening through the first wafer without penetrating any active circuit, and to extend the second through-silicon via opening toward, but not through, any active circuit formed in the first wafer.

5. The method of claim 1, further comprising:
patterning and etching a second plurality of through-silicon via openings in at least a second integrated circuit in a separate wafer, comprising:
at least a third through-silicon via opening that extends entirely through the second wafer without penetrating any active circuit formed in the second wafer, and
at least a fourth through-silicon via opening that extends toward, but does not contact or penetrate, an active circuit in the second wafer;
forming one or more conductive layers in the second plurality of through-silicon via openings to form a second plurality of through-silicon via structures which are positioned for alignment with the first plurality of through-silicon via structures; and
bonding the second wafer to the first wafer in which is formed the first plurality of through-silicon via structures such that at least one of the second plurality of through-silicon via structures formed in the second wafer is aligned to contact at least one of the first plurality of through-silicon via structures in the first wafer for thermally conducting heat.

6. The method of claim 1, wherein patterning and etching the first plurality of through-silicon via openings comprises patterning and etching the first plurality of through-silicon via openings to be substantially uniformly distributed on the first wafer.

7. The method of claim 1, wherein forming one or more conductive layers comprises electroplating copper into the first plurality of through-silicon via openings.

8. The method of claim 1, further comprising forming a heat sink in thermal contact with the first plurality of through-silicon via structures.

9. The method of claim 1, wherein forming one or more conductive layers comprises depositing one or more conductive layers in the first plurality of through-silicon via openings to form at least a first thermally conductive through-silicon via structure that extends entirely through the first wafer without penetrating any of the one or more active circuits, and at least a second thermally conductive through-silicon via structure that extends partially through the first circuit toward one of the one or more active circuits in the first wafer.

10. A method of fabricating an integrated circuit having a plurality of device layers, comprising:
providing a first wafer substrate comprising a plurality of chip areas, each chip area comprising one or more active circuits formed on a first side of the first wafer substrate; and
forming first and second conductive through-silicon via structures in each of the plurality of chip areas, the first conductive through-silicon via structure extending through the first wafer substrate from an opening in the first side to an opening in a second side without contacting any of the one or more active circuits, and the second conductive through-silicon via structure partially extending through the first wafer substrate along a path, the path extending from the first side through at least one of the active circuit to the second side, wherein the second through-silicon via structure does not contact and does not penetrate any active circuit in the integrated circuit.

11. The method of claim 10, wherein providing the first wafer substrate comprises providing a silicon wafer substrate layer.

12. The method of claim 10, wherein forming first and second conductive through-silicon via structures comprises:
selectively etching first and second through-silicon via openings in each of the plurality of chip areas on a second side of the first wafer substrate such that the first through-silicon via opening extends through the first wafer substrate, and the second through-silicon via opening extends partially through the first wafer substrate toward, but not contacting and not penetrating, the one or more active circuits in the first wafer substrate; and
forming one or more conductive layers in the first and second through-silicon via openings in each of the plurality of chip areas to form the first and second conductive through-silicon via structures.

13. The method of claim 12, wherein selectively etching first and second through-silicon via openings comprises:
depositing a photoresist layer over the second side of the first wafer substrate;
patterning and etching the photoresist layer to form an etch mask comprising a first pattern opening for the first through-silicon via opening that is larger than a second pattern opening for the second through-silicon via opening; and
anisotropically etching the first wafer substrate using the etch mask to extend the first through-silicon via opening through the first wafer substrate without penetrating any active circuit, and to extend the second through-silicon via opening partially through the first wafer substrate without extending through any of the one or more active circuit.

14. The method of claim 12, wherein forming one or more conductive layers comprises electroplating copper into the first and second through-silicon via openings.

15. The method of claim 10, wherein forming first and second conductive through-silicon via structures comprises:
forming an etch mask over a second side of the first wafer substrate to define a first set of relatively larger mask openings and a second set of relatively smaller mask openings in each of the plurality of chip areas, where the first set of relatively larger mask openings are not positioned over the one or more active circuits and the second set of relatively smaller mask openings are positioned over the one or more active circuits;
anisotropically etching the first wafer substrate using the etch mask to form a first set of through-silicon via openings below the first set of relatively larger mask openings and a second set of through-silicon via openings below the second set of relatively smaller mask openings, where the first set of through-silicon via openings extend through the first wafer substrate, and the second set of through-silicon via openings extend only partially through the first wafer substrate; and forming one or more conductive layers in the first set of through-silicon via openings and the second set of through-silicon via openings in each of the plurality of chip areas to form conductive through-silicon via structures.

16. The method of claim 15, wherein forming the etch mask comprises forming the etch mask to define the first set of relatively larger mask openings which are positioned outside of the one or more active circuits to align with any conductive through-silicon via structures formed in a second wafer substrate that is bonded to the first side of the first wafer substrate.

17. The method of claim 10, further comprising:

providing a second wafer substrate comprising a plurality of chip areas, each chip area comprising one or more active circuits formed on a first side of the second wafer substrate;

forming a first set of conductive through-silicon via structures in each of the plurality of chip areas of the second wafer substrate which extend through the second wafer substrate without penetrating any of the one or more active circuits formed on the first side of the second wafer substrate, where each of the first set of conductive through-silicon via structures in the second wafer substrate is positioned for alignment with a corresponding first conductive through-silicon via structure in the first wafer substrate; and bonding a second side of the second wafer substrate to the first side of the first wafer substrate such that at least one of the first set of conductive through-silicon via structures in the second wafer substrate is aligned to contact a corresponding first conductive through-silicon via structure in the first wafer substrate.

18. The method of claim 10, further comprising:

providing a second wafer substrate comprising a plurality of chip areas, each chip area comprising one or more active circuits formed on a first side of the second wafer substrate;

forming a second set of conductive through-silicon via structures in each of the plurality of chip areas of the second wafer substrate which extend only partially through the second wafer substrate without penetrating any of the one or more active circuits formed on the first side of the second wafer substrate, where each of the second set of conductive through-silicon via structures in the second wafer substrate is positioned for alignment with a corresponding first conductive through-silicon via structure in the first wafer substrate; and bonding a second side of the second wafer substrate to the first side of the first wafer substrate such that at least one of the second set of conductive through-silicon via structures in the second wafer substrate is aligned to contact a corresponding first conductive through-silicon via structure in the first wafer substrate.

19. The method of claim 10, further comprising:

providing a second wafer substrate comprising a plurality of chip areas, each chip area comprising one or more active circuits formed on a first side of the second wafer substrate;

forming a second set of conductive through-silicon via structures in each of the plurality of chip areas of the second wafer substrate which extend through the second wafer substrate without penetrating any of the one or more active circuits formed on the first side of the second wafer substrate; and bonding a first side of the second wafer substrate to a second side of the first wafer substrate such that each of the first and second conductive through-silicon via structures in the first wafer substrate is aligned to contact a corresponding one of the second set of conductive through-silicon via structures in the second wafer substrate.

* * * * *